United States Patent [19]

Qayyum

[11] Patent Number: 4,706,266

[45] Date of Patent: Nov. 10, 1987

[54] DUAL MODE-INCREMENT/DECREMENT N-BIT COUNTER REGISTER

[75] Inventor: Asif Qayyum, San Jose, Calif.

[73] Assignee: Advanced Micro Devices, Inc., Sunnyvale, Calif.

[21] Appl. No.: 927,308

[22] Filed: Nov. 5, 1986

[51] Int. Cl.⁴ ............... H03K 23/52; H03K 23/66
[52] U.S. Cl. .................................. 377/33; 377/117; 377/121; 377/123
[58] Field of Search ............. 377/33, 115, 117, 121, 377/123, 126, 125

[56] References Cited

U.S. PATENT DOCUMENTS

| | | | |
|---|---|---|---|
| 3,546,597 | 12/1970 | Lipke | 377/33 |
| 4,280,190 | 7/1981 | Smith | 377/126 |
| 4,509,183 | 4/1985 | Wright | 377/126 |
| 4,611,337 | 9/1986 | Evans | 377/123 |

Primary Examiner—John S. Heyman
Attorney, Agent, or Firm—Patrick T. King; Davis Chin; J. Vincent Tortolano

[57] ABSTRACT

A counter cell for counting either up or down by one or two includes a multiplexer section, an increment/decrement section, and a carry section. The multiplexer section is responsive to control signals and input carry signals for generating a count signal which determines the counting by one or two. The increment/decrement section is responsive to count signal and an increment strobe signal for generating an incremented output signal and a decremented output signal. The carry section is responsive to the increment/decrement section and the input carry signals for generating a carryout-by-one signal and a carryout-by-two signal. A number of these counter cells are arrayed to form an N-bit counter.

20 Claims, 13 Drawing Figures

| PRESENT | | | | BY ONE | NEXT | | | |
|---|---|---|---|---|---|---|---|---|
| $a_3$ | $a_2$ | $a_1$ | $a_0$ | | $b_3$ | $b_2$ | $b_1$ | $b_0$ |
| 0 | 0 | 0 | 0 | | 0 | 0 | 0 | 1 |
| 0 | 0 | 0 | 1 | | 0 | 0 | 1 | 0 |
| 0 | 0 | 1 | 0 | | 0 | 0 | 1 | 1 |
| 0 | 0 | 1 | 1 | | 0 | 1 | 0 | 0 |
| 0 | 1 | 0 | 0 | | 0 | 1 | 0 | 1 |
| 0 | 1 | 0 | 1 | | 0 | 1 | 1 | 0 |
| 0 | 1 | 1 | 0 | | 0 | 1 | 1 | 1 |
| 0 | 1 | 1 | 1 | | 1 | 0 | 0 | 0 |
| 1 | 0 | 0 | 0 | | 1 | 0 | 0 | 1 |
| 1 | 0 | 0 | 1 | | 1 | 0 | 1 | 0 |
| 1 | 0 | 1 | 0 | | 1 | 0 | 1 | 1 |
| 1 | 0 | 1 | 1 | | 1 | 1 | 0 | 0 |
| 1 | 1 | 0 | 0 | | 1 | 1 | 0 | 1 |
| 1 | 1 | 0 | 1 | | 1 | 1 | 1 | 0 |
| 1 | 1 | 1 | 0 | | 1 | 1 | 1 | 1 |
| 1 | 1 | 1 | 1 | | 0 | 0 | 0 | 0 |

$b_0 = a_0'$
SET $b_1 = a_0$
SET $b_2 = a_0 \cdot a_1$
SET $b_3 = a_0 \cdot a_1 \cdot a_2$

FIG. 6A

| PRESENT | | | | BY TWO | NEXT | | | |
|---|---|---|---|---|---|---|---|---|
| $a_3$ | $a_2$ | $a_1$ | $a_0$ | | $b_3$ | $b_2$ | $b_1$ | $b_0$ |
| 0 | 0 | 0 | 0 | | 0 | 0 | 1 | 0 |
| 0 | 0 | 0 | 1 | | 0 | 0 | 1 | 1 |
| 0 | 0 | 1 | 0 | | 0 | 1 | 0 | 0 |
| 0 | 0 | 1 | 1 | | 0 | 1 | 0 | 1 |
| 0 | 1 | 0 | 0 | | 0 | 1 | 1 | 0 |
| 0 | 1 | 0 | 1 | | 0 | 1 | 1 | 1 |
| 0 | 1 | 1 | 0 | | 1 | 0 | 0 | 0 |
| 0 | 1 | 1 | 1 | | 1 | 0 | 0 | 1 |
| 1 | 0 | 0 | 0 | | 1 | 0 | 1 | 0 |
| 1 | 0 | 0 | 1 | | 1 | 0 | 1 | 1 |
| 1 | 0 | 1 | 0 | | 1 | 1 | 0 | 0 |
| 1 | 0 | 1 | 1 | | 1 | 1 | 0 | 1 |
| 1 | 1 | 0 | 0 | | 1 | 1 | 1 | 0 |
| 1 | 1 | 0 | 1 | | 1 | 1 | 1 | 1 |
| 1 | 1 | 1 | 0 | | 0 | 0 | 0 | 0 |
| 1 | 1 | 1 | 1 | | 0 | 0 | 0 | 1 |

$b_0 = a_0$
SET $b_1 = a_1'$
SET $b_2 = a_1$
SET $b_3 = a_2 \cdot a_1$

FIG. 6B

DUAL MODE-INCREMENT/DECREMENT N-BIT COUNTER REGISTER

BACKGROUND OF THE INVENTION

This invention relates generally to semiconductor integrated circuit devices and more particularly, it relates to a dual mode N-bit counter which may be used to count either up or down by one or two.

There are known in the prior art a number of counter circuits, but they tend to suffer from the disadvantage in that such counter circuits could either only count up or count down. Further, many of these prior art counters were formed of irregular structures which increased substantially the cost in design layout and manufacturing. In addition, these conventional counter circuits were quite complex since a relatively large number of components were used in their implementation and thus required the use of increased amounts of chip area, thereby adding to the expense of production.

It would therefore be desirable to provide a dual mode N-bit counter which can be used to count either up or down by one or two. It would be expedient to have such a dual mode N-bit counter contain a plurality of identical bit cells, each cell being formed with a smaller number of components than has been traditionally required. Further, it would also be expedient to construct each bit cell to be of a regular configuration or structure so as to conform to a repeatable pattern suitable for very large scale integration (VLSI) with high packing density.

SUMMARY OF THE INVENTION

Accordingly, it is a general object of the present invention to provide a dual mode N-bit counter which is relatively simple and economical to manufacture and assemble, but yet overcomes the disadvantages of the prior art counter circuits.

It is an object of the present invention to provide a dual mode N-bit counter which can be used to count either up or down by one or two.

It is another object of the present invention to provide a dual mode N-bit counter which is formed of a relatively small number of components, thereby reducing IC chip size and power dissipation.

It is still another object of the present invention to provide a dual mode N-bit counter formed of a plurality of identical bit cells or stages in which each bit cell thereof has a regular structure suitable for very large scale integration.

In accordance with these aims and objectives, the present invention is concerned with the provision of a counter cell for counting either up or down by one or two which includes a multiplexer section, an increment/decrement section, and a carry section. The multiplexer section is responsive to control counter signals and input carry signals for generating a count signal which determines the counting by one or two. The increment/decrement section is responsive to the count signal and a preset input data signal for generating an incremented output signal and a decremented output signal. The carry section is responsive to the increment/decrement section and the input carry signals for generating a carryout-by-one signal and a carryout-by-two signal.

In another aspect of the invention, three of the counter cells or stages of the present invention are arrayed to form a 3-bit counter. In still another aspect of the present invention, sixteen of the counter cells are arranged to form a 16-bit dual mode counter register which counts by one or two.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 6(a) shows the counter sequence and the logic equations thereof for an increment-by-one up/counter; and FIG. 6(b) shows the counter sequence and the logic equations thereof for an increment-by-two up/counter.

DESCRIPTION OF THE PREFERRED EMBODIMENT

Figure 1:
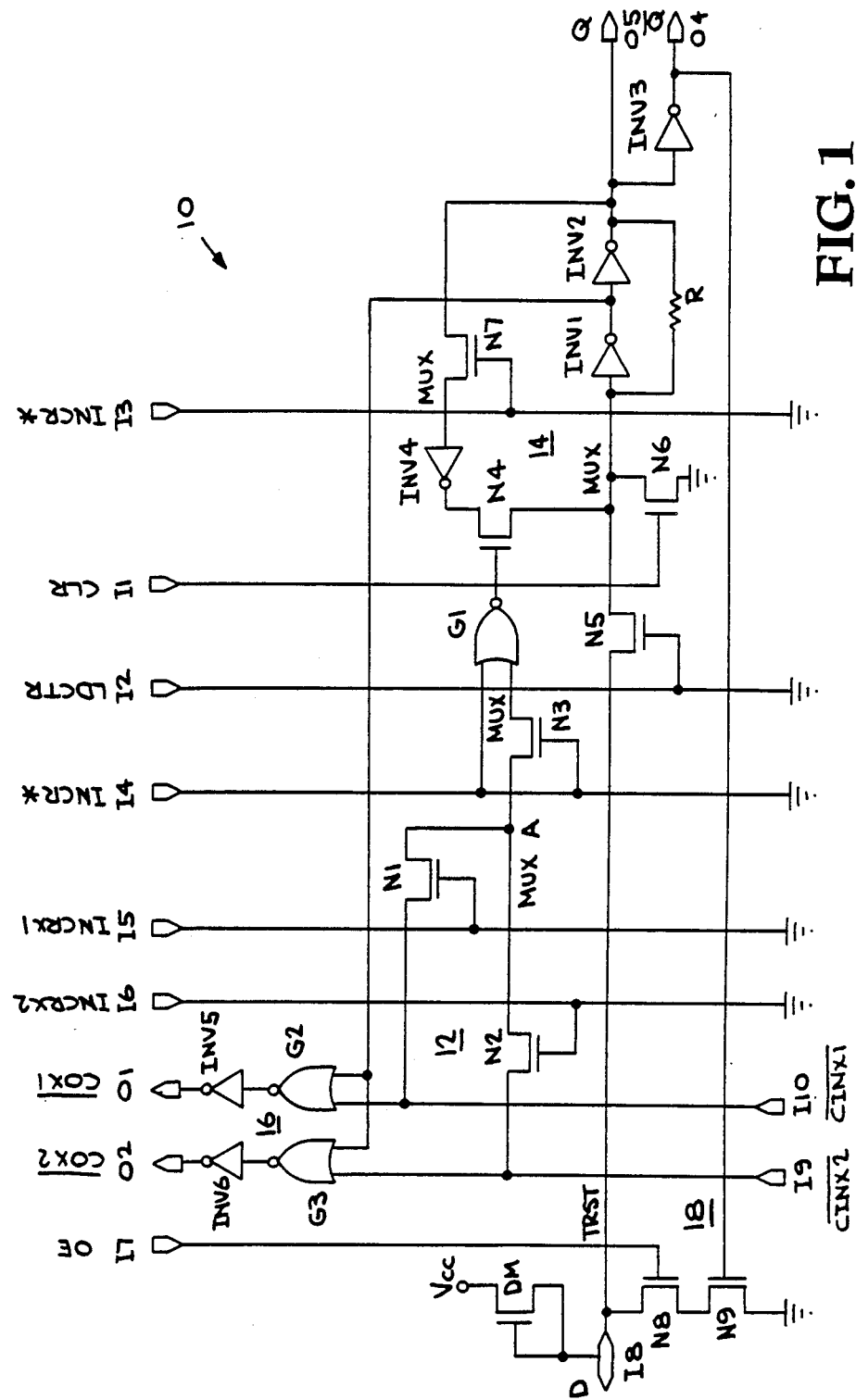
FIG. 1 is a schematic circuit diagram of a counter cell of the present invention.

Referring now in detail to the drawings, there is shown in FIG. 1 a schematic circuit diagram of a counter cell or bit 10 which is used to implement a dual mode increment/decrement N-bit counter register of the present invention. The counter cell 10 is constructed with a relatively small number of circuit components so as to use a reduced amount of semiconductor chip area, thereby reducing manufacturing costs and power consumption. Further, the counter cell 10 is formed as a part of a monolithic IC with a regular configuration suitable for use in large scale integration circuit arrays which may be mass produced.

The counter cell 10 receives nine input signals consisting of a clear-counter signal CLR on input terminal I1, a load-counter signal LDCTR on input terminal I2, an increment strobe signal INCR* on input terminals I3 and I4, increment-by-one signal INCRX1 in input terminal I5, an increment-by-two signal INCRX2 on input terminal I6, an output-enable or read signal OE on input terminal I7, a preset data input or address signal D on input terminal I8, a complement carryin-by-two signal $\overline{\text{CINX2}}$ on input terminal I9, and a complement carryin-by-one signal $\overline{\text{CINX1}}$ on input terminal I10. The counter cell provides four output signals consisting of a complement carryout-by-one signal $\overline{\text{COX1}}$ on output terminal O1, a complement carryout-by-two signal $\overline{\text{COX2}}$ on output terminal O2, an incremented output signal Q on output terminal O5, and a decremented output signal $\overline{\text{Q}}$ on output terminal O4.

The counter cell 10 is formed of a multiplexer section 12, an increment/decrement section 14, a carry section 16, and an output enable or read section 18. The multiplexer section 12 includes a first coupling or pass N-channel MOS transistor N1 and a second coupling or pass N-channel MOS transistor N2. The transistor N1 has its drain connected to the input terminal I10 for receiving the complement carryin-by-one signal $\overline{\text{CINX1}}$, and the transistor N2 has its drain connected to the input terminal I9 for receiving the complement carryin-by-two signal $\overline{CINX2}$. For the bit "0", the terminals I9 and I10 are connected to a ground potential since this bit is always changed. The sources of the transistors N1 and N2 are connected together and to an internal node A for providing a count signal. The gate of the transistor N1 is connected to the input terminal I5 for receiving the increment-by-one or count-by-one signal INCRX1. This signal INCRX1 is a control signal which is used to cause the cell to count by one. The gate of the transistor N2 is connected to the input terminal I6 for receiving the increment-by-two or count-by-two signal INCRX2. This signal INCRX2 is a control signal which is used to cause the cell to count by two.

The increment/decrement section 14 includes a two-input NOR logic gate G1, pass N-channel MOS transistors N3–N7, and inverters INV1–INV4. The NOR gate G1 has one of its inputs connected to the input terminal I4 for receiving the increment strobe signal INCR* and has its other input connected to the source of the transistor N3. The transistor N3 has its drain connected to the count signal at the internal node A defining the output of the multiplexer section 12. The output of the NOR gate G1 is connected to the gate of the transistor N4. The transistor N4 has its drain connected to the output of the fourth inverter INV4. The transistor N4 has its source connected to the source of the transistor N5, the drain of the transistor N6, and to the input of the first inverter INV1. The transistor N5 has its drain connected to the input terminal I8 for receiving the preset data input signal D and its gate connected to the input terminal I2 for receiving the load-counter signal LDCTR. The transistor N6 has its gate connected to the input terminal I1 for receiving the clear-counter signal CLR and its source connected to a ground potential.

The first and second inverters INV1, INV2 define a latch in which the output of the first inverter INV1 is connected to the input of the second inverter INV2 and the output of the second inverter INV2 is connected to the input of the first inverter INV1 via a resistor R. The resistor R may be implemented by an N-channel depletion-mode MOS transistor whose gate and drain electrodes are connected together as is well known in the art. The output of the second inverter INV2 is connected to the output terminal O5 which provides the incremented output signal Q. Further, the output of the second inverter INV2 is connected to the input of the third inverter INV3. The output of the third inverter INV3 is connected to the output terminal O4 which provides the decremented signal Q. The output of the second inverter INV2 is also connected to the drain of the transistor N7 whose source is joined to the input of the fourth inverter INV4. The gate of the transistor N7 is connected to the input terminal I3 for receiving the increment strobe signal INCR*.

The carry section 16 includes a pair of two-input NOR logic gates G2, G3 and a pair of fifth and sixth inverters INV5, INV6. The NOR gate G2 has one of its inputs connected to one input of the NOR gate G3 and to the output of the first inverter INV1. The other input of the NOR gate G2 is connected to the input terminal I10 for receiving the complement carryin-by-one signal $\overline{CINX1}$, and the other input of the NOR gate G3 is connected to the input terminal I9 for receiving the complement carryin-by-two signal $\overline{CINX2}$. The output of the NOR gate G2 is connected to the input of the fifth inverter INV5 whose output is connected to the output terminal O1 for supplying the complement carryout-by-one signal $\overline{COX1}$. The output of the NOR gate G3 is connected to the input of the sixth inverter INV6 whose output is connected to the output terminal O2 for supplying the complement carryout-by-two signal $\overline{COX2}$.

The read section 18 includes a depletion mode transistor DM, an eight pass N-channel MOS transistor N8, and a ninth pass N-channel MOS transistor N9. The transistor DM has its gate and source electrodes connected together and to the input terminal I8. The transistor DM has its drain connected to a supply potential or voltage VCC. The common gate and source electrodes of the transistor DM is further joined to the drain of the eighth transistor N8. The eight pass transistor N8 has its gate connected to the input terminal I7 for receiving the output-enable signal OE and has its source connected to the drain of the ninth pass transistor N9. The ninth pass transistor N9 has its gate connected to the output of the third inverter INV3 and its source connected to the ground potential.

Figure 5:
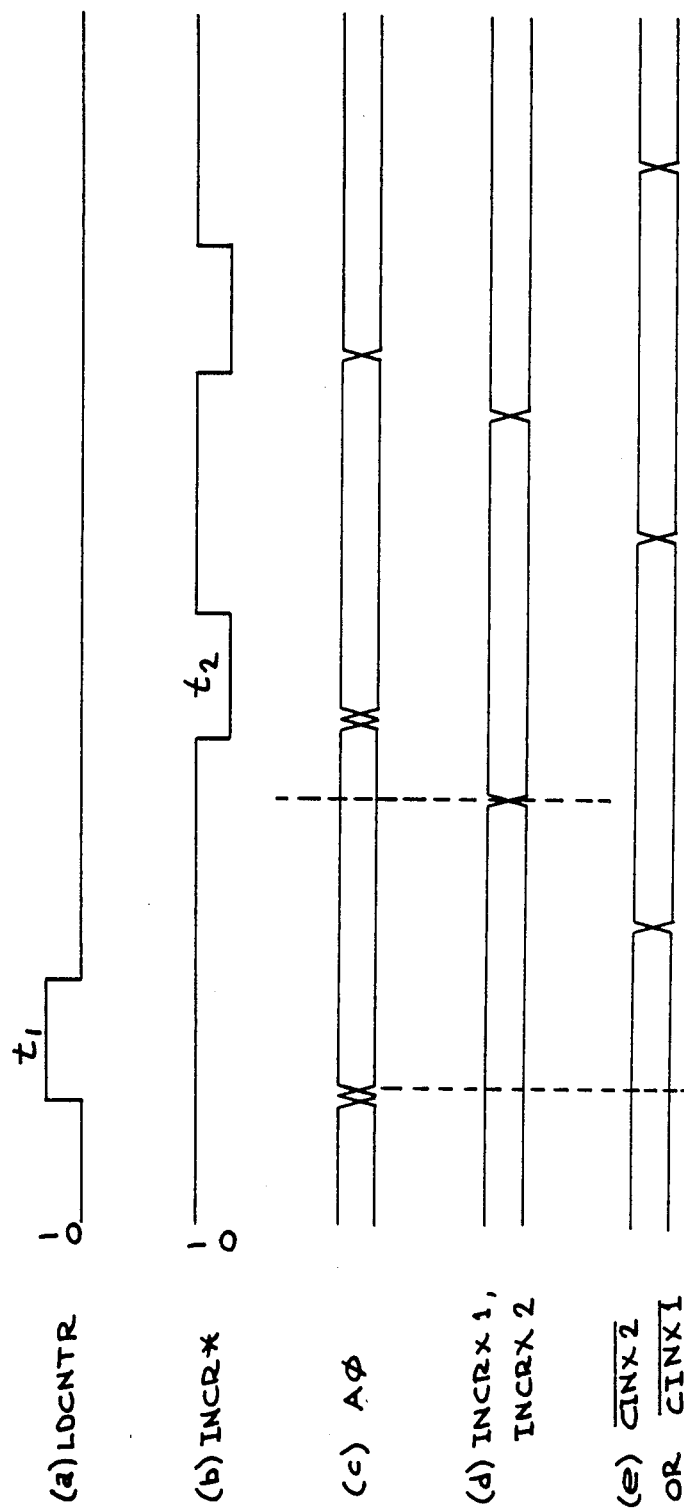
FIGS. 5(a)–5(e) are timing diagrams useful in understanding the operation of the counter cell of FIG. 1.

FIGS. 5(a) through 5(e) are timing diagrams which are useful in understanding the operation of the counter cell 10. The load-counter signal LDCTR is used to load or preset the data value into the counter cell at a time interval t1 as is shown in FIG. 5(a). During this time interval t1, the increment strobe signal INCR* is at a high or "1" logic level as is illustrated in FIG. 5(b). The current data value AO shown in FIG. 5(c) is loaded into the counter cell during this time interval t1. In order to count, the increment strobe signal INCR(*) of FIG. 5(b) is pulled to a low or "0" logic level. The counter cell counts by one or two dependent upon which one of the control signals INCRX1 or INCRX2 illustrated in FIG. 5(d) is high. It will be noted that the control signal INCRX1 or INCRX2 must be valid prior to the time when the increment strobe signal INCR* goes low and must remain valid during the time interval t2.

If the control signal INCRX1 applied to the input terminal I5 is at a high logic level, then the counter cell will count by one. If the control signal INCX2 applied to the input terminal I6 is at a high logic level, then the counter cell will count by two. It should be understood that only one of the input terminals I5 or I6 will be at a "1" logic level. The complement carryout-by-one signal $\overline{COX1}$ from the counter cell is fed to the input terminal I10 of the next higher bit cell. Similarly, the carryout-by-two signal $\overline{COX2}$ from the counter cell is fed to the input terminal I9 of the next higher bit cell. The carryin signals $\overline{CINX1}$ and $\overline{CINX2}$ affect whether the next preceding bit cell will count or not count and are illustrated in FIG. 5(e). The values of the carryin signals $\overline{CINX1}$ and $\overline{CINX2}$ depend upon the data value AO loaded during the time interval t1, or changed value of A$\phi$ from previous t2. It will be noted that the carryin signals must be valid prior to the time interval t2 when the increment strobe signal INCR* goes low.

Referring again to FIG. 1, the operation of the counter cell 10 will be explained first by assuming that the data input D on the input terminal I8 is at a high logic level (D=1) and that it is desired to count-by-one, i.e., a high logic level is to be applied to the input terminal I5. Initially, when the increment strobe signal INCR* on the input terminal I3 and I4 is at a high logic level, the input data (D=1) is loaded into the counter cell by applying the load-counter signal LDCTR to the input terminal I2 which goes to a high logic level. This renders the transistor N5 to be conductive so as to pass the present data input through to the output terminals O5 and O4. The output signal on the terminal O5 will be preset at Q=1, and the output signal on the output terminal O4 will be preset at $\bar{Q}$=0. Further, the output signal Q will be available at the drain of the transistor N4 since the transistor N7 is turned on (INCR*=1 at the time t1). Also, the carryin-by-one signal $\overline{CINX1}$ on the input terminal I10 will pass through the transistors N1 and N3, since they are both turned on, to the second input of the NOR gate G1. This is because both signals INCRX1 and INCR* will be at a high logic level prior to the time t2.

If the signal $\overline{CINX1}$=0, when the increment strobe signal INCR* is pulled to a low level at the time t2, the output of the NOR gate G1 will be at a high logic level causing the transistor N4 to be turned on. Since the transistor N7 is turned off at the time t2, the output of the fourth inverter INV4 will be latched to the complement of the output signal Q. Thus, the inverted value of the current count will pass through the transistor N4 and to the output of the register formed by the inverters INV1 and INV2. Consequently, the output signal Q will now be inverted. On the other hand, if the signal $\overline{CINX1}$=1, when the increment strobe signal INCR* is pulled to a low level at the time t2, the output of the NOR gate G1 will be at a low logic level, causing the transistor N4 to be turned off. Therefore, the signal from the output of the fourth inverter INV4 will not be sent through the transistor N4 and the register. Thus the output signal Q will remain unchanged and stay in its current condition. If it was desired to count-by-two, the signal INCRX2 applied to the input terminal 16 would be caused to go to a high logic level rather than the signal INCRX1 on the terminal 15. As a result, the carryin-by-two signal $\overline{CINX2}$ would be passed through the transistors N2 and N3 to the second input of the NOR gate G1 prior to the time t2 when the increment strobe signal INCR* goes low.

Figure 2:
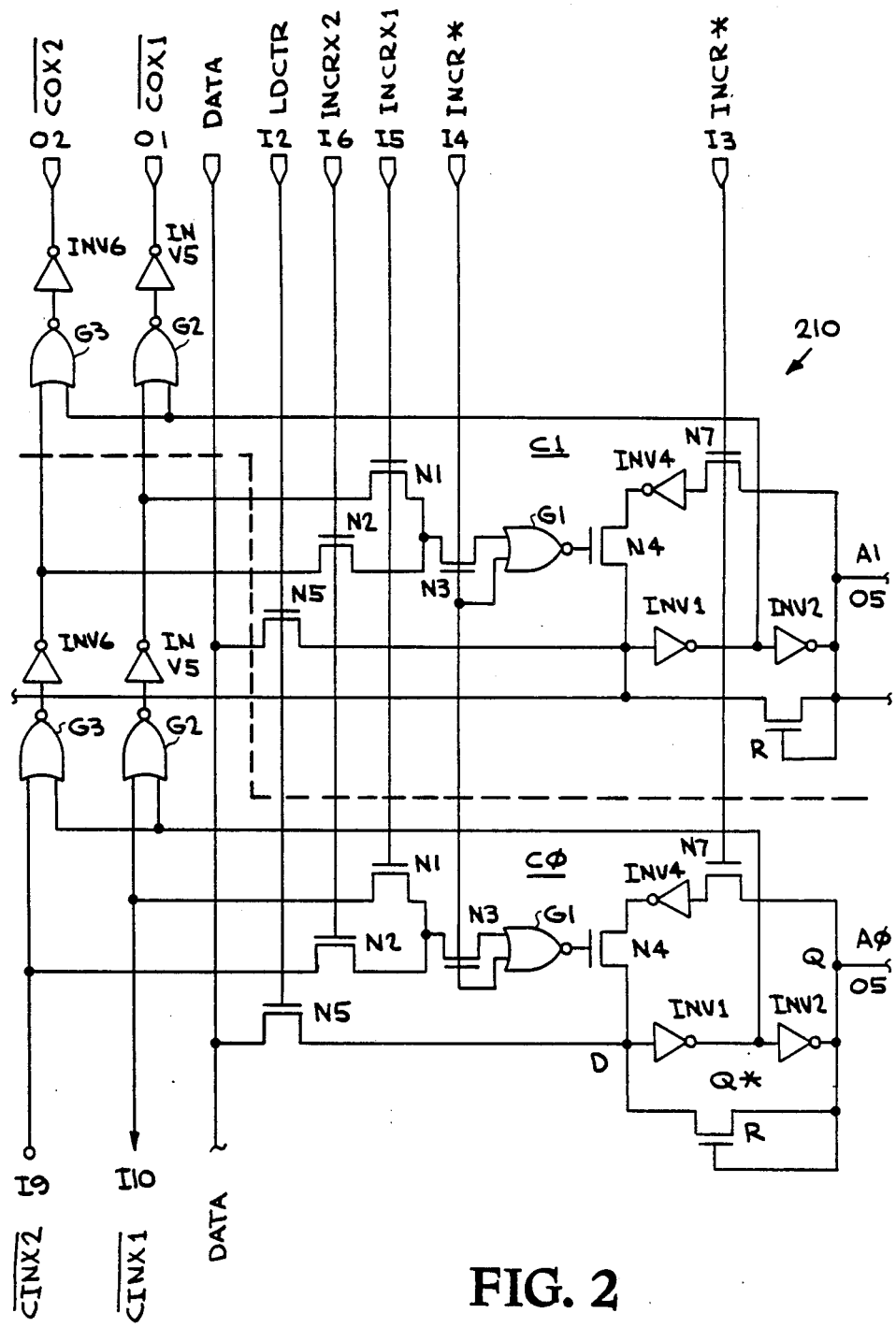
FIG. 2 is a schematic circuit diagram of a 2-bit counter of the present invention.

Any number of identical counter cells or bits 10 referred to as a counter stage can be arrayed to implement a dual mode N-bit counter of the present invention which can be used to count either up or down by one or two. With reference to FIG. 2, there is illustrated a two-bit up/counter 210 which is exemplary of the present invention. As can be seen from the schematic circuit diagram, the counter 210 is formed of two identical cells C0 and C1. Each of the cells C0 and C1 is similar to the cell 10 of FIG. 1, with the like parts being designated by the same reference numerals. It will be noted that a third inverter INV3 of FIG. 1 has been omitted since this circuit functions as an up/counter counting either by one or two.

Figure 3A:
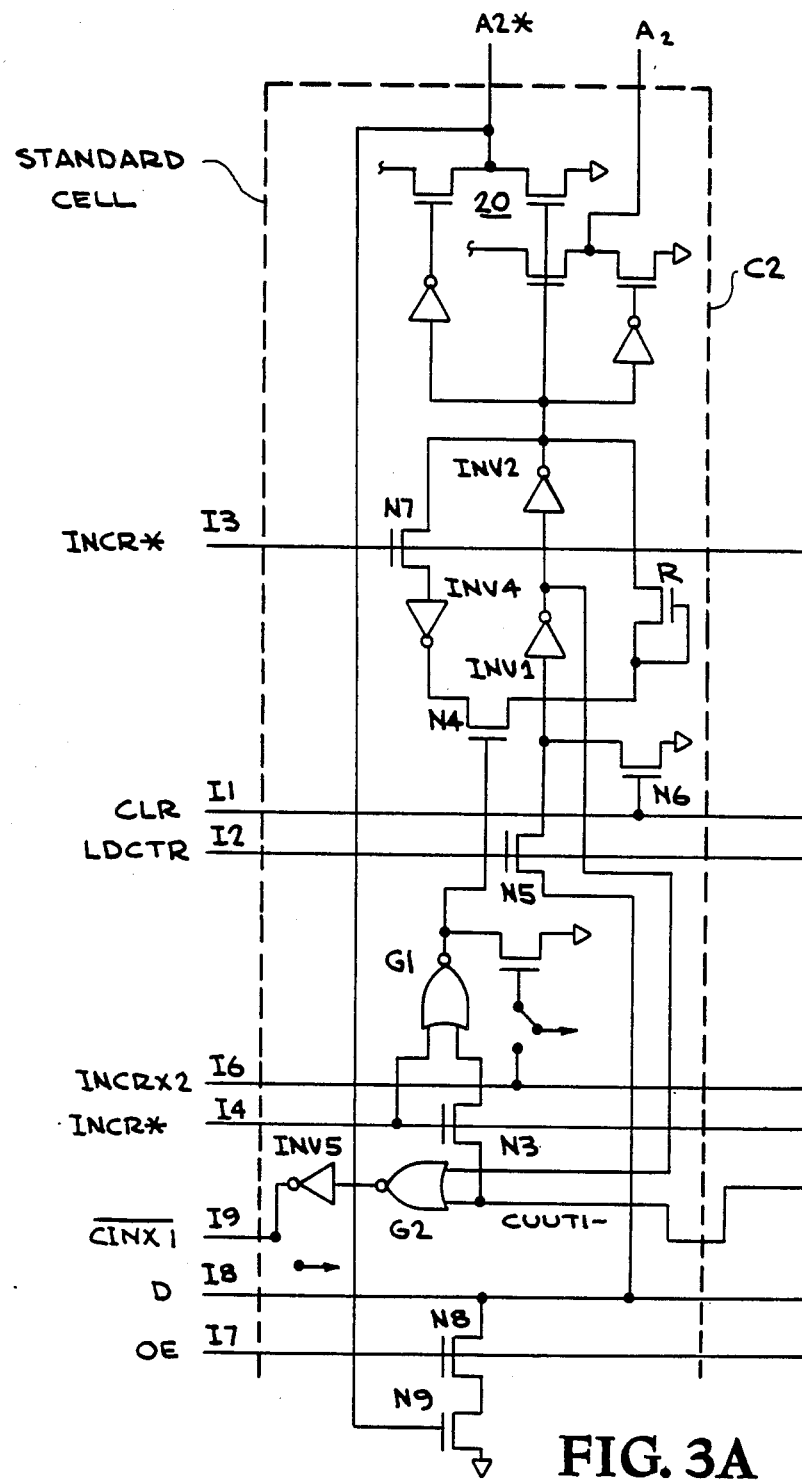
FIG. 3 is a schematic circuit diagram of a 3-bit counter of the present invention.
Figure 3B:
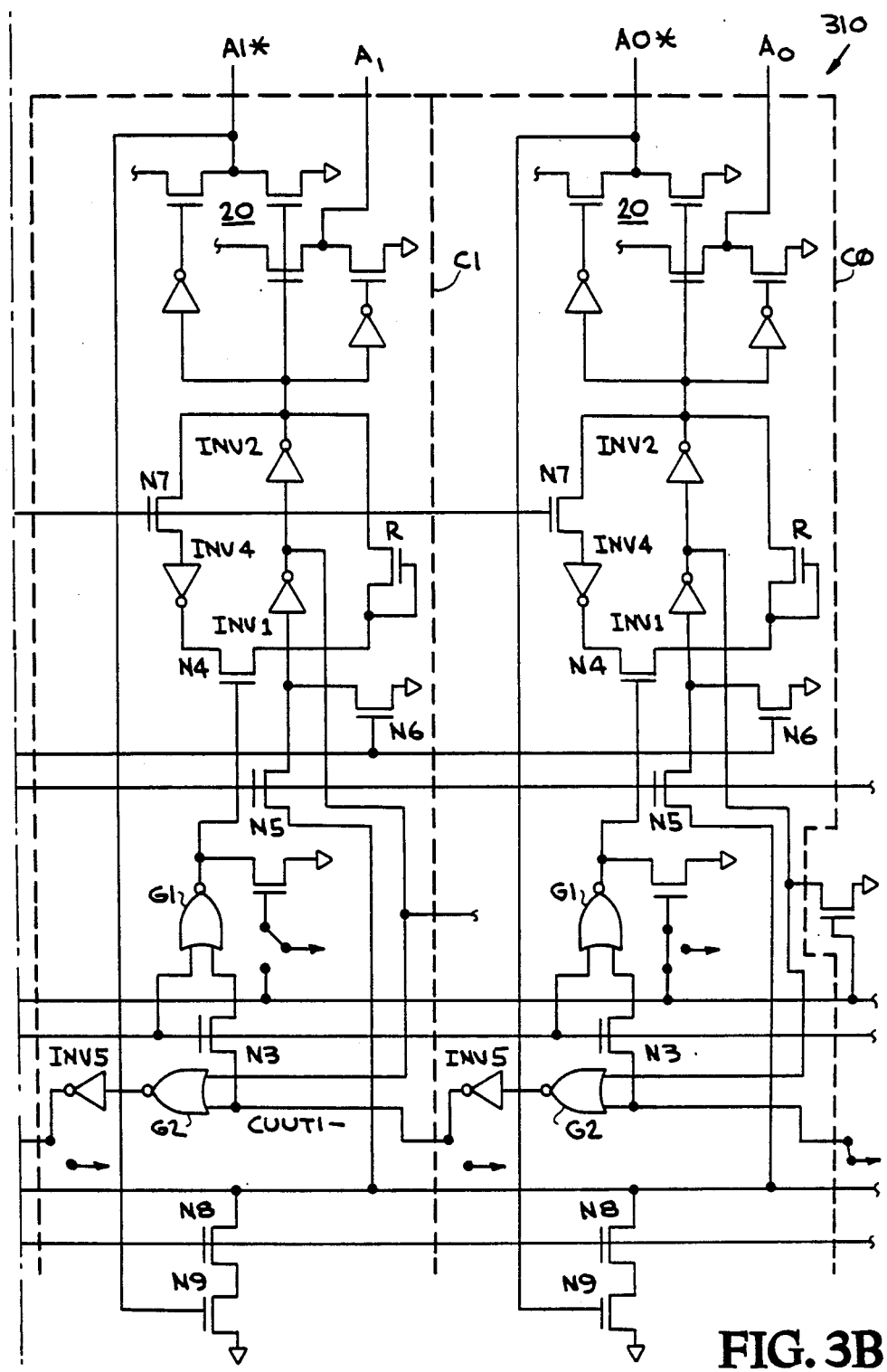

In FIG. 3, there is illustrated a three-bit up/down counter 310 which counts by one. As can be seen from the schematic circuit diagram, the counter 310 is formed of three identical cells C0, C1, and C2. Each of the cells C0, C1, C2 is similar to the cell 10 of FIG. 1, with like parts being designated by the same reference numerals. It will be noted that the third inverter INV3 of FIG. 1 has been replaced by a buffer section 20 which provides the incremented output signals A0, A1, A2 and the decremented output signals A0*, A1*, A2*. The buffer section 20 has been added to enable a higher drive capability. Further, it can be seen that the logic gate G3 and the inverter INV6 have been omitted since this circuit functions as an up/down counter which counts by one.

Figure 4:
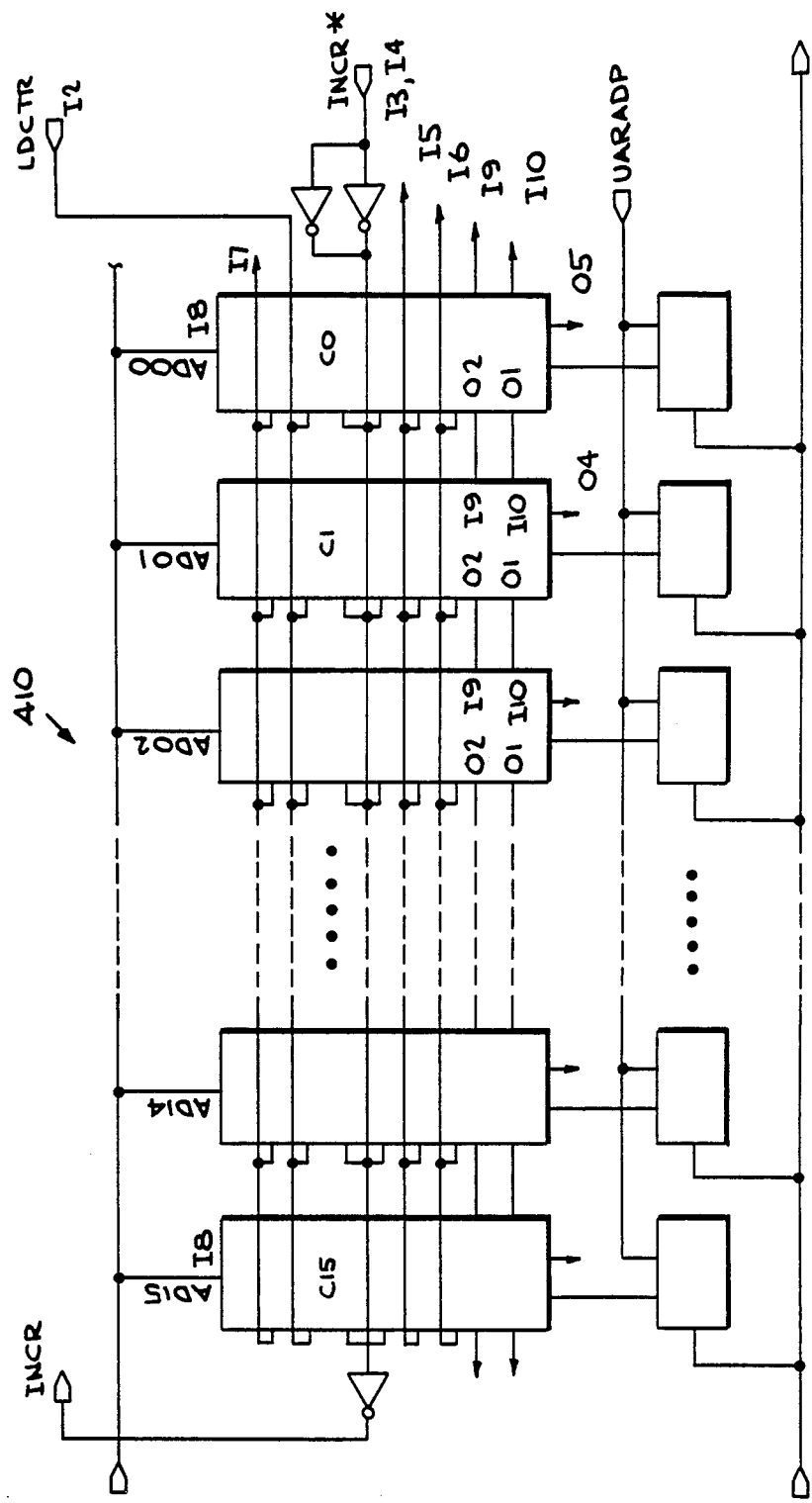
FIG. 4 is a block diagram of a 16-bit counter, in accordance with a preferred embodiment of the invention.

In FIG. 4, there is illustrated in block diagram from a 16-bit up/down counter 410 for counting by one or two which represents a preferred embodiment of the present invention. As can be seen from the block diagram, the counter 410 is formed of sixteen identical cells or stages C0, C1 ... C15. Each of the cells C0, C1 ... C15 is similar to the cell 10 of FIG. 1. The preset data input signals AD00 ... AD15 are fed to corresponding ones of the cells C0 ... C15 via the input terminals 18. Each cell further receives the output-enable or read signal 0E on its input terminal I7, the load-counter signal LDCTR on its input terminal I2, the increment strobe signal INCR* on its input terminals I3 and I4, the complement carryin-by-one signal CINX1 on its input terminal I9, and the complement carryin-by-two signal CINX2 on the input terminal I10. Each cell provides the incremented output signal on the output terminal O5 and the decremented output signal on the output terminal O4. The complement carryout-by-one signal COX1 is provided on the output terminal O1, and the complement carryout-by-two signal COX2 is provided on the output terminal O2. Except for the bit "0", each cell has its input terminals I9 and I10 connected to the respective output terminals O2 and O1 of the next lower cell. For the bit "0", the input terminals I9 and I10 are connected to a ground potential since this cell is always changed.

The details of the count sequence and logic equations for a typical 4-bit up-counter which counts by one is shown in FIG. 6(a). The present or current values of the four-bits are represented by $a_3$, $a_2$, $a_1$, and $a_0$. The incremented values after the incremented strobe signal INCRX* has been applied to the four-bits are represented by $b_3$, $b_2$, $b_1$, and $b_0$. The incremented values of the four-bits are expressed as a function of their present values in the four equations shown in FIG. 6(a). Similarly, the details of the count sequence and logic sequence for a typical 4-bit up/counter which counts by two is shown in FIG. 6(b). The incremented values of the four-bits are expressed as a function of their present values in the four equations illustrated in FIG. 6(b).

The dual mode N-bit counter of the present invention has advantages over the prior art counters as follows:

(1) It functions to count either up or down by one or two;

(2) It is formed of a plurality of identical counter cells, each cell having a regular structure so as to be suitable for very large scale integration; and (3) Each cell is constructed with a relatively small number of components, thereby reducing the required amount of chip area.

From the foregoing detailed description, it can thus be seen that the present invention provides an improved counter cell for counting either up or down by one or two which includes a multiplexer section, an increment-/decrement section, and a carry section. Further, any number of such counter cells may be connected to form an N-bit counter which counts either up or down by one or two.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A counter cell for counting either up or down by one or two, said counter cell comprising:

a multiplexer section being formed of a first pass transistor and a second pass transistor whose sources are connected together and to an internal node, said first pass transistor having its drain coupled to a complement carryin-by-one signal and its gate coupled to an increment-by-one signal, said second pass transistor having its drain coupled to a complement carryin-by-two signal and its gate coupled to an increment-by-two signal;

an increment/decrement section being formed of a first two-input NOR gate, third through seventh pass transistors, and first through fourth inverters;

said first NOR gate having one of its inputs coupled to an increment strobe signal and its other input connected to the source of said third pass transistor, said third pass transistor having its drain connected to the internal node and its gate coupled to the increment strobe signal, said first NOR gate having its output connected to the gate of said fourth pass transistor;

said fourth pass transistor having its drain connected to the output of said fourth inverter and having its source connected to the source of said fifth pass transistor, the drain of said sixth pass transistor and the input of said first inverters;

said fifth pass transistor having its drain coupled to a preset data input signal and its gate coupled to a load-counter signal, said sixth pass transistor having its gate coupled to a clear-counter signal and its source connected to a ground potential;

said first inverter having its output connected to the input of said second inverter, said second inverter having its output connected to the input of said first inverter via a resistor, said second inverter having its output further connected to the input of said third inverter, the drain of said seventh pass transistor, and a first output terminal for generating an incremented output signal;

said third inverter having its output connected to a second output terminal for generating a decremented output signal, said seventh pass transistor having its gate coupled to the incremented strobe signal and its source connected to the input of said fourth inverter;

a carry section being formed of second and third two-input NOR gates and fifth and sixth inverters;

said second NOR gate having one of its inputs connected to one input of said third NOR gate and to the output of said first inverter, the other input of said second NOR gate being coupled to a complement carryout-by-one signal, the other input of said third NOR gate being coupled to a complement carryout-by-two signal;

said fifth inverter having its input connected to the output of said second NOR gate and its output coupled to a third output terminal for generating a complement carryout-by-one signal; and said sixth inverter having its input connected to the output of said third NOR gate and its output coupled to a fourth output terminal for generating a complement carryout-by-two signal.

2. A counter cell as claimed in claim 1, further comprising a read section formed of eighth and ninth pass transistors, said eighth transistor having its drain coupled to the preset data input signal, gate coupled to an output-enable signal and source connected to the drain of said ninth pass transistor, said ninth pass transistor having its gate connected to the output of said third inverter and its source connected to the ground potential.

3. A counter cell as claimed in claim 1, wherein each of said first through seventh pass transistors comprises an N-channel MOS transistor.

4. A counter cell as claimed in claim 1, wherein a plurality of said counter cells are arrayed to form an N-bit counter register.

5. A counter cell as claimed in claim 1, wherein said first through seventh pass transistors are N-channel MOS transistors.

6. A counter cell as claimed in claim 1, further comprising a depletion mode transistor having its drain connected to a supply potential, the gate and source of said depletion mode transistor being connected together and to the preset data input signal.

7. A counter cell as claimed in claim 1, wherein said counter cells are arrayed to form a 3-bit up/down counter which counts by one or two.

8. A counter cell as claimed in claim 1, wherein sixteen of said counter cells are arrayed to form a 16-bit up/down counter which counts by one or two.

9. A dual mode N-bit register formed of a plurality of identical counter stages for counting either up or down by one or two, each counter stage comprising:

a multiplexer section being formed of a first pass transistor and a second pass transistor whose sources are connected together and to an internal mode, said first pass transistor having its drain coupled to a complement carryin-by-one signal and its gate coupled to an increment-by-one signal, said second pass transistor having its drain coupled to a complement carryin-by-two signal and its gate coupled to an increment-by-two signal;

an increment/decrement section being formed of a first two-input NOR gate, third through seventh pass transistors, and first through fourth inverters;

said first NOR gate having one of its inputs coupled to an increment strobe signal and its other input connected to the source of said third pass transistor, said third pass transistor having its drain connected to the internal node and its gate coupled to the increment strobe signal, said first NOR gate having its output connected to the gate of said fourth pass transistor;

said fourth pass transistor having its drain connected to the output of said fourth inverter and having its source connected to the source of said fifth pass transistor, the drain of said sixth pass transistor and the input of said first inverters;

said fifth pass transistor having its drain coupled to a preset data input signal and its gate coupled to a load-counter signal, said sixth pass transistor having its gate coupled to a clear-counter signal and its source connected to a ground potential;

said first inverter having its output connected to the input of said second inverter, said second inverter having its output connected to the input of said first inverter via a resistor, said second inverter having its output further connected to the input of said third inverter, the drain of said seventh pass transistor, and a first output terminal for generating an incremented output signal;

said third inverter having its output connected to a second output terminal for generating a decremented output signal, said seventh pass transistor having its gate coupled to the incremented strobe signal and its source connected to the input of said fourth inverter;

a carry section being formed of second and third two-input NOR gates and fifth and sixth inverters;

said second NOR gate having one of its inputs connected to one input of said third NOR gate and to the output of said first inverter, the other input of said second NOR gate being coupled to a complement carryout-by-one signal, the other input of said third NOR gate being coupled to a complement carryout-by-two signal;

said fifth inverter having its input connected to the output of said second NOR gate and its output coupled to a third output terminal for generating a complement carryout-by-one signal; and said sixth inverter having its input connected to the output of said third NOR gate and its output coupled to a fourth output terminal for generating a complement carryout-by-two signal.

10. A counter cell as claimed in claim 9, further comprising a read section formed of eight and ninth pass transistors, said eighth transistor having its drain coupled to the preset data input signal, gate coupled to an output enable signal and source connected to the drain of said ninth pass transistor, said ninth pass transistor having its gate connected to the output of said third inverter and its source connected to the ground potential.

11. A counter cell as claimed in claim 9, wherein each of said first through seventh pass transistors comprises an N-channel MOS transistor.

12. A counter cell as claimed in claim 9, wherein a plurality of said counter cells are arrayed to form an N-bit counter register.

13. A counter cell as claimed in claim 9, wherein said first through seventh pass transistors are N-channel MOS transistors.

14. A counter cell as claimed in claim 9, further comprising a depletion mode transistor having its drain connected to a supply potential, the gate and source of said depletion mode transistor being connected together and to the preset data input signal.

15. A counter cell for counting either up or down by one or two, said counter cell comprising:
multiplexing means responsive to control signals and input carry signals for generating a count signal which determines the counting by one or two;
increment/decrement means responsive to said count signal and an increment strobe signal for generating an incremented output signal and a decremented output signal; and
carry means responsive to said increment/decrement means and said input carry signals for generating a carryout-by-one signal and a carryout-by-two signal.

16. A counter cell as claimed in claim 15, wherein said multiplexing means comprises a pair of first and second pass transistors.

17. A counter cell as claimed in claim 16, wherein said increment/ decrement means comprises a first two-input NOR gate, third through seventh pass transistors, and first through fourth inverters.

18. A counter cell as claimed in claim 17, wherein said carry means comprises second and third NOR gates and fifth and sixth inverters.

19. A counter cell as claimed in claim 16, wherein said first and second pass transistors comprise N-channel MOS transistors.

20. A counter cell as claimed in claim 17, wherein said third through seventh pass transistors comprise N-channel MOS transistors.

* * * * *